US012813071B2

(12) United States Patent
Wang et al.

(10) Patent No.: US 12,813,071 B2
(45) Date of Patent: Nov. 24, 2026

(54) DISPLAY PANEL WITH IMPROVED HYSTERESIS CHARACTERISTICS

(71) Applicant: WUHAN CHINA STAR OPTOELECTRONICS SEMICONDUCTOR DISPLAY TECHNOLOGY CO., LTD., Wuhan (CN)

(72) Inventors: Wei Wang, Wuhan (CN); Weibin Zhang, Wuhan (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 729 days.

(21) Appl. No.: 17/264,835

(22) PCT Filed: Oct. 23, 2020

(86) PCT No.: PCT/CN2020/123079

§ 371 (c)(1),
(2) Date: May 8, 2023

(87) PCT Pub. No.: WO2022/047919

PCT Pub. Date: Mar. 10, 2022

(65) Prior Publication Data

US 2023/0276659 A1 Aug. 31, 2023

(30) Foreign Application Priority Data

Sep. 3, 2020 (CN) ......................... 202010914606.1

(51) Int. Cl.
*H10K 59/121* (2023.01)
*H10K 59/131* (2023.01)

(52) U.S. Cl.
CPC ..... *H10K 59/1213* (2023.02); *H10K 59/1216* (2023.02); *H10K 59/131* (2023.02)

(58) Field of Classification Search
CPC ........... H10K 59/1213; H10K 59/1216; H10K 59/131; H10K 59/12; H10D 86/60; H10D 86/441; H10D 86/481
See application file for complete search history.

(56) References Cited

U.S. PATENT DOCUMENTS

2012/0056904 A1* 3/2012 Lhee .................... H10K 59/131 345/77
2015/0228223 A1* 8/2015 Park ..................... H10K 59/353 345/77

(Continued)

FOREIGN PATENT DOCUMENTS

CN 102891163 A 1/2013
CN 102903326 A 1/2013

(Continued)

OTHER PUBLICATIONS

International Search Report in International application No. PCT/CN2020/123079,mailed on Jun. 9, 2021.

(Continued)

*Primary Examiner* — Jacob Y Choi
*Assistant Examiner* — Grace Cha
(74) *Attorney, Agent, or Firm* — PV IP PC; Peter Stecher; Wei Te Chung

(57) ABSTRACT

The present invention provides a display panel. A first power line is electrically connected to a first capacitor through at least one first via hole, and the first capacitor is electrically connected to a first driving thin film transistor (TFT). A second power line is electrically connected to a second capacitor through at least one second via hole, and the second capacitor is electrically connected to a second driving TFT. An opening area of the at least one first via hole is (Continued)

a first opening area, an opening area of the at least one second via hole is a second opening area, and the first opening area is larger than the second opening area.

17 Claims, 2 Drawing Sheets

(56) References Cited

U.S. PATENT DOCUMENTS

| | | | | |
|---|---|---|---|---|
| 2016/0321996 | A1 | 11/2016 | Lee et al. | |
| 2020/0144336 | A1* | 5/2020 | Xiong | H10K 59/123 |
| 2020/0190122 | A1 | 6/2020 | Bae et al. | |

FOREIGN PATENT DOCUMENTS

| | | | |
|---|---|---|---|
| CN | 202695445 | U | 1/2013 |
| CN | 103073444 | A | 5/2013 |
| CN | 106920814 | A | 7/2017 |
| CN | 107275368 | A | 10/2017 |
| CN | 108074957 | A | 5/2018 |
| CN | 207764776 | U | 8/2018 |
| CN | 109935622 | A | 6/2019 |
| CN | 110034132 | A | 7/2019 |
| CN | 110136651 | A | 8/2019 |
| CN | 110299107 | A | 10/2019 |
| CN | 110600514 | A | 12/2019 |

OTHER PUBLICATIONS

Written Opinion of the International Search Authority in International application No. PCT/CN2020/123079,mailed on Jun. 9, 2021.

Chinese Office Action issued in corresponding Chinese Patent Application No. 202010914606.1 dated Mar. 26, 2023, pp. 1-6.

* cited by examiner

DISPLAY PANEL WITH IMPROVED HYSTERESIS CHARACTERISTICS

RELATED APPLICATIONS

This application is a Notional Phase of PCT Patent Application No. PCT/CN2020/123079 having international filing date of Oct. 23, 2020, which claims the benefit of priority of Chinese Patent Application No. 202010914606.1 filed on Sep. 3, 2020. The contents of the above applications are all incorporated by reference as if fully set forth herein in their entirety.

FIELD OF DISCLOSURE

The present invention relates to a field of display technology and in particular, to a display panel.

DESCRIPTION OF RELATED ART

In active-matrix organic light-emitting diode (AMOLED) display panels, thin film transistors made with low-temperature polysilicon technology have serious hysteresis, which leads to fluctuations in an output current of the transistor, causing brightness of an OLED device controlled by the transistor to deviate from a design value. The hysteresis problem results in afterimages on display images, and the afterimage level of the image is strongly correlated with the image; that is, under a same grayscale, the afterimage problem of the green image is serious, and the afterimage problem of the red image is lighter.

SUMMARY

The present invention provides a display panel to solve a problem that thin film transistors made by the low-temperature polysilicon technology in conventional organic light-emitting diode (OLED) panels have serious hysteresis, which leads to fluctuations in an output current of the transistors, resulting in afterimages of a green image and/or a red image under a same grayscale.

According to one embodiment of the present invention, a display panel is provided. The display panel comprises a substrate and a first driving thin film transistor (TFT), a second driving TFT, a first capacitor, a second capacitor, a first power line, a second power line, a first organic light-emitting diode (OLED) device, and a second OLED device arranged on the substrate, wherein the first OLED device and the second OLED device emit light of different colors;

wherein the first power line is electrically connected to the first capacitor through at least one first via hole, the first capacitor is electrically connected to the first driving TFT, and the first driving TFT is electrically connected to the first OLED device; the second power line is electrically connected to the second capacitor through at least one second via hole, the second capacitor is electrically connected to the second driving TFT, and the second driving TFT is electrically connected to the second OLED device;

an opening area of the at least one first via hole is a first opening area, an opening area of the at least one second via hole is a second opening area, and the first opening area is larger than the second opening area; and the first OLED device is a green OLED device, and the second OLED device is a first non-green OLED device.

In the display panel according to one embodiment of the present invention, the display panel further comprises a third driving TFT, a third capacitor, a third power line, and a second non-green OLED device;

the third power line is electrically connected to the third capacitor through at least one third via hole, the third capacitor is electrically connected to the third driving TFT, and the third driving TFT is electrically connected to the second non-green OLED device; and an opening area of the at least one third via hole is a third opening area, and the first opening area is larger than the third opening area.

In the display panel according to one embodiment of the present invention, the first non-green OLED device is one of a red OLED device and a blue OLED device, and the second non-green OLED device is the other one of the red OLED device and the blue OLED device.

In the display panel according to one embodiment of the present invention, the second opening area is equal to the third opening area.

In the display panel according to one embodiment of the present invention, the first non-green OLED device is the red OLED device, and the second non-green OLED device is the blue OLED device; and the second opening area is larger than the third opening area.

In the display panel according to one embodiment of the present invention, a number of the at least one first via hole is greater than a number of the at least one second via hole and a number of the at least one third via hole.

The present invention provides a display panel, comprising a first driving thin film transistor (TFT), a second driving TFT, a first capacitor, a second capacitor, a first power line, a second power line, a first organic light-emitting diode (OLED) device, and a second OLED device, wherein the first OLED device and the second OLED device emit light of different colors;

wherein the first power line is electrically connected to the first capacitor through at least one first via hole, the first capacitor is electrically connected to the first driving TFT, and the first driving TFT is electrically connected to the first OLED device; the second power line is electrically connected to the second capacitor through at least one second via hole, the second capacitor is electrically connected to the second driving TFT, and the second driving TFT is electrically connected to the second OLED device; and an opening area of the at least one first via hole is a first opening area, an opening area of the at least one second via hole is a second opening area, and the first opening area is larger than the second opening area.

In the display panel according to one embodiment of the present invention, the first OLED device is a green OLED device, and the second OLED device is a first non-green OLED device.

In the display panel according to one embodiment of the present invention, the display panel further comprises a third driving TFT, a third capacitor, a third power line, and a second non-green OLED device;

the third power line is electrically connected to the third capacitor through at least one third via hole, the third capacitor is electrically connected to the third driving TFT, and the third driving TFT is electrically connected to the second non-green OLED device; and an opening area of the at least one third via hole is a third opening area, and the first opening area is larger than the third opening area.

In the display panel according to one embodiment of the present invention, the first non-green OLED device is one of a red OLED device and a blue OLED device, and the second non-green OLED device is the other one of the red OLED device and the blue OLED device.

In the display panel according to one embodiment of the present invention, the second opening area is equal to the third opening area.

In the display panel according to one embodiment of the present invention, the first non-green OLED device is the red OLED device, and the second non-green OLED device is the blue OLED device; and the second opening area is larger than the third opening area.

In the display panel according to one embodiment of the present invention, a number of the at least one first via hole is greater than a number of the at least one second via hole and a number of the at least one third via hole.

In the display panel according to one embodiment of the present invention, a number of the at least one first via hole is equal to a number of the at least one second via hole and a number of the at least one third via hole.

In the display panel according to one embodiment of the present invention, the first power line and the first capacitor are arranged in different layers, the first power line is arranged on the first capacitor, and an interlayer dielectric layer is arranged between the first power line and the first capacitor, and the first via hole is defined in the interlayer dielectric layer and exposes the first capacitor; and the first power line is connected to the first capacitor through the first via hole.

In the display panel according to one embodiment of the present invention, the second power line and the third power line are arranged in the same layer as the first power line; the second capacitor and the third capacitor are arranged in the same layer as the first capacitor; the second via hole and the third via hole are defined in the interlayer dielectric layer, the second via hole exposes the second capacitor, and the third via hole exposes the third capacitor; and the second power line is connected to the second capacitor through the second via hole, and the third power line is connected to the third capacitor through the third via hole.

In the display panel according to one embodiment of the present invention, the first driving TFT comprises a first gate, and the first capacitor comprises the first gate and a first electrode stacked on the first gate; the first via hole overlaps the first electrode; and an orthographic projection of the first via hole projected on a plane where the first gate is located is outside the first gate.

In the display panel according to one embodiment of the present invention, the second driving TFT comprises a second gate, and the second capacitor comprises the second gate and a second electrode stacked on the second gate; the second via hole overlaps the second electrode; and an orthographic projection of the second via hole projected on a plane where the second gate is located is outside the second gate.

In the display panel according to one embodiment of the present application, the first via hole is a round hole or a square hole.

In the display panel according to one embodiment of the present invention, the first opening area is N times the second opening area, and N is a positive integer greater than one.

In the display panel according to one embodiment of the present invention, the first opening area is between 2 times and 3 times the second opening area.

Advantages of the Present Invention

In the display panel of the present invention, the first power line and the first capacitor are electrically connected to the green OLED device, and the second power line and the second capacitor are electrically connected to the first non-green OLED device. The first power line is electrically connected to the first capacitor through at least one first via hole, and the second power line is electrically connected to the second capacitor through at least one second via hole.

The opening area of at least one first via hole is the first opening area, the opening area of at least one second via hole is the second opening area, and the first opening area is set to be larger than the second opening area to thereby enhance hydrogen removal of the first driving TFT and change the electrical properties of the first driving TFT, thus improving the afterimage.

BRIEF DESCRIPTION OF DRAWINGS

In order to more clearly illustrate the embodiments of the present disclosure or related art, figures which will be described in the embodiments are briefly introduced hereinafter. It is obvious that the drawings are merely for the purposes of illustrating some embodiments of the present disclosure, and a person having ordinary skill in this field can obtain other figures according to these figures without inventive work.

DETAILED DESCRIPTION OF EMBODIMENTS

Figure 1:
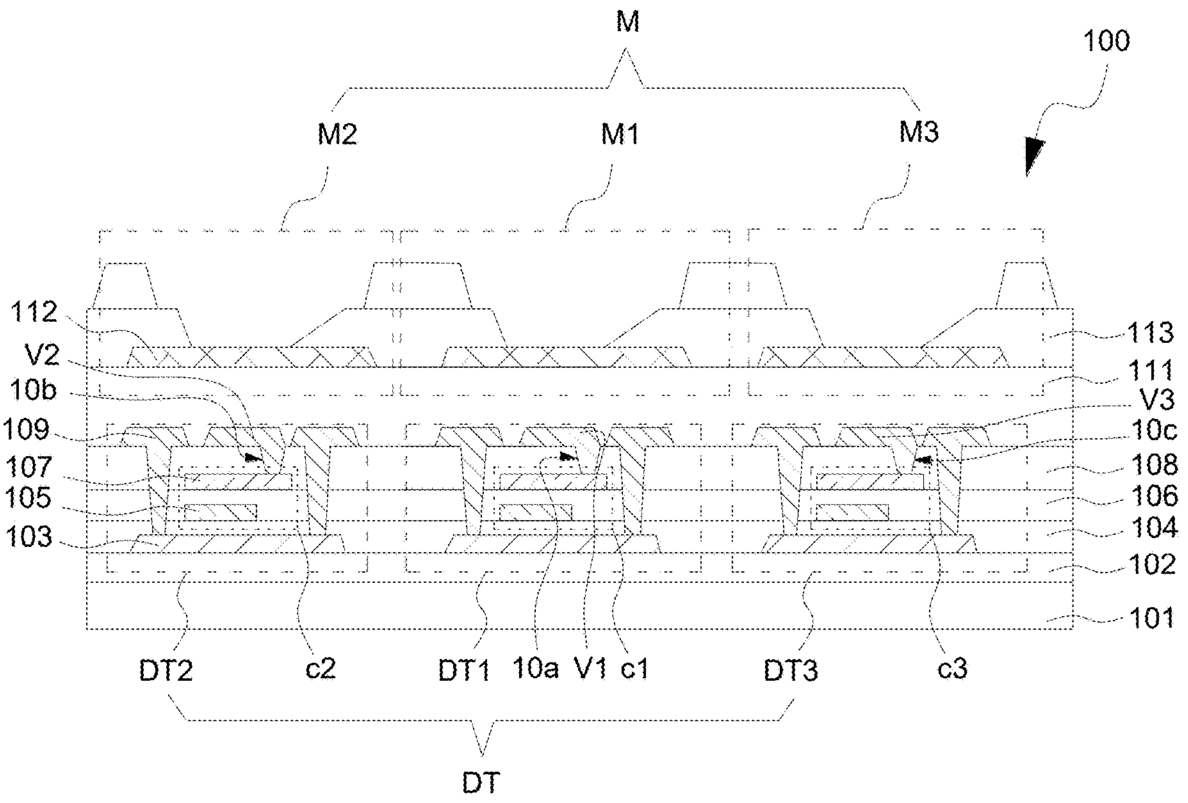
FIG. 1 is a schematic structural view illustrating a display panel according to one embodiment of the present invention.

The technical solutions of the present invention are clearly and completely described below in conjunction with the accompanying drawings and specific embodiments. Obviously, the described embodiments are only some of the embodiments of the present invention, rather than all the embodiments. Based on the embodiments of the present invention, all other embodiments obtained by those skilled in the art without creative work shall fall within the protection scope of the present invention.

In the description of the present invention, it should be noted that the terms "first" and "second" are only used for illustrative purposes, and cannot be construed as indicating or implying relative importance or implicitly indicating the number of indicated technical features. Therefore, the features defined with "first" and "second" may explicitly or implicitly include one or more of the features.

In the description of the present invention, it should be noted that the terms "connected" and "coupled" should be understood in a broad sense, unless otherwise clearly defined and specified. For example, two elements can be directly connected to each other or indirectly connected through an intermediary. For those of ordinary skill in the art, the specific meanings of the above terms in the present invention can be understood on a case-by-case basis.

In the present invention, unless otherwise clearly defined and specified, a first element being "on" a second element can mean that the two elements make direct contact, or can mean that the two elements make no direct contact, and they make contact through an additional element between them.

Moreover, the first element being arranged "over" or "above" the second element can mean that the first element being directly above and obliquely above the second element, or it can simply mean that the first element is higher in level than the second element.

The following disclosure provides many different embodiments or examples for realizing different structures of the present invention. To simplify the disclosure of the present invention, components and configurations of specific examples are described below. Certainly, they are only examples, and are not intended to limit the present invention. In addition, the present invention may repeat reference numerals and/or reference letters in different examples. Such repetition is for the purpose of simplification and clarity, and does not indicate the relationship between the various embodiments and/or configurations discussed. In addition, the present invention provides examples of various specific processes and materials, but those of ordinary skill in the art can be aware of other applicable processes and/or the use of other materials.

Please refer to FIG. 1, which is a schematic cross-sectional structural view of a display panel according to one embodiment of the present invention. A display panel 100 is provided according to one embodiment of the present invention. The display panel 100 comprises an organic light-emitting diode (OLED) device layer M and a driving thin film transistor (TFT) structure layer DT, and the driving TFT structure layer DT is electrically connected to the OLED device layer M. The driving TFT structure layer DT is used to deliver current to the OLED device layer M to drive an OLED device to emit light.

It is preferable that, the driving TFT structure layer DT can be used in a 7T1C pixel driving circuit and a 6T1C pixel driving circuit, or other pixel driving circuits. The present embodiment takes a 7T1C pixel driving circuit as an example for description; however, the present embodiment is not limited in this regard.

Figure 2:
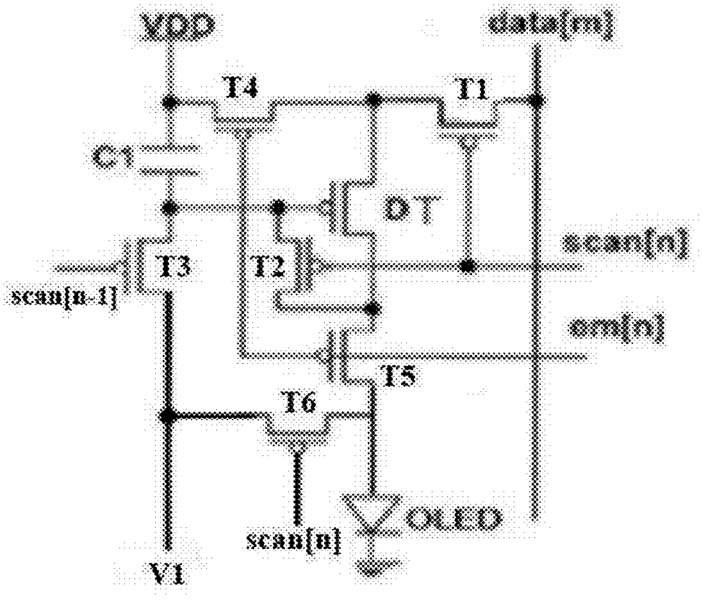
FIG. 2 is an equivalent circuit diagram of a pixel driving circuit of the display panel according to one embodiment of the present invention.

As shown in FIG. 2, a gate of the driving TFT DT is electrically connected to a first end of a second TFT T2 one end of a capacitor C1, and a first end of a third TFT T3; a first end of the driving TFT DT is electrically connected to a second end of a first TFT T1 and a first end of a fourth TFT T4; and a second end of the driving TFT DT is electrically connected to a first end of a fifth TFT T5 and a second end of the second TFT T2.

A gate of the fifth TFT T5 is electrically connected to a gate of the fourth TFT T4 and a signal line em[n]; a second end of the fifth TFT T5 is electrically connected to a second end of a sixth TFT T6 and the OLED device. The other end of the capacitor C1 is electrically connected to a voltage line VDD and a second end of the fourth TFT T4.

A first end of the first TFT T1 is electrically connected to a data line data[m]. A gate of the first TFT T1 is electrically connected to a second scan line scan[n] and a gate of the second TFT T2. A gate of the third TFT T3 is electrically connected to a first scan line scan[n−1]. A second end of the third TFT T3 is electrically connected to a first end of the sixth TFT T6. A gate of the sixth TFT T6 is electrically connected to the second scan line scan[n].

In detail, the driving TFT structure layer DT comprises a buffer layer 102, an active layer 103, a first insulating layer 104, a first gate metal layer 105, a second insulating layer 106, a second gate metal layer 107, an interlayer dielectric layer 108, and a source-drain metal layer 109 formed sequentially on a substrate 101.

Figure 3:
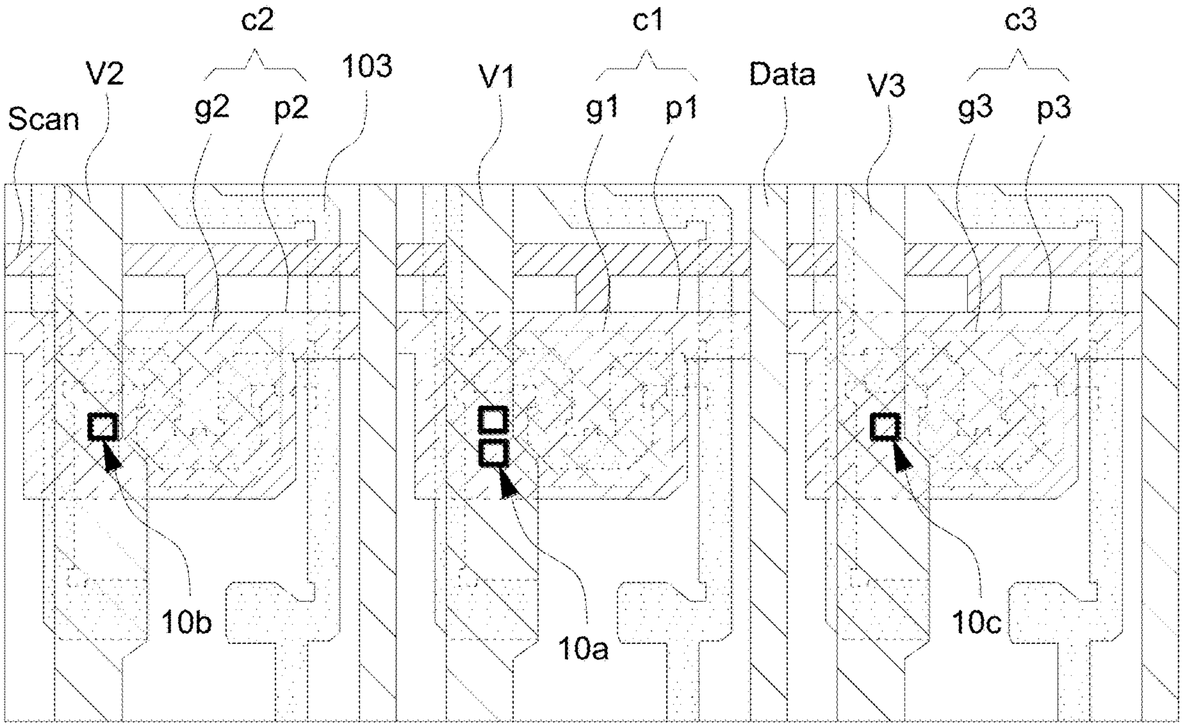
FIG. 3 is a schematic top view which illustrates a partial structure of the display panel according to one embodiment of the present invention.

As shown in FIG. 3, the first gate metal layer 105 comprises a scan line Scan, a first gate g1, a second gate g2, and a third gate g3. The second gate metal layer 107 comprises a first electrode p1, a second electrode p2, and a third electrode p3.

The first gate g1 and the first electrode p1 overlap to form a first capacitor c1. The second gate g2 and the second electrode p2 overlap to form a second capacitor c2. The third gate g3 and the third electrode p3 overlap to form a third capacitor c3.

The source-drain metal layer 109 comprises a data line Data, a first power line V1, a second power line V2, a third power line V3, a source, and a drain.

A first via hole 10*a*, a second via hole 10*b*, and a third via hole 10*c* are defined in the interlayer dielectric layer 108. The first via hole 10*a* overlaps the first electrode p1. An orthographic projection of the first via hole 10*a* projected on a plane where the active layer 103 is located is outside the active layer 103. An orthographic projection of the first via hole 10*a* projected on a plane where the first gate metal layer 105 is located is outside the first gate g1 to prevent the first via hole 10*a* from affecting a storage capacity (i.e., capacitance) of the first capacitor c1.

The second via hole 10*b* overlaps the second electrode p2. An orthographic projection of the second via hole 10*b* projected on the plane where the active layer 103 is located is outside the active layer 103. An orthographic projection of the second via hole 10*b* projected on the plane where the first gate metal layer 105 is located is outside the second gate g2 to prevent the second via hole 10*b* from affecting a storage capacity of the second capacitor c2.

The third via hole 10*c* overlaps the third electrode p3. An orthographic projection of the third via hole 10*c* projected on the plane where the active layer 103 is located is outside the active layer 103. An orthographic projection of the third via hole 10*c* projected on the plane where the first gate metal layer 105 is located is outside the third gate g3 to prevent the third via hole 10*c* from affecting a storage capacity of the third capacitor c3.

The OLED device layer M comprises a planarization layer 111, an anode 112, and a pixel definition layer 113 that are sequentially formed on the source-drain metal layer 109. Certainly, in the present embodiment, the OLED device layer M further comprises an organic light-emitting layer, a cathode, and an encapsulation layer that are sequentially arranged on the anode 112.

As shown in FIG. 1, the driving TFT structure layer DT comprises a first driving TFT DT1, a second driving TFT DT2, the first capacitor c1, the second capacitor c2, the first power line V1, and the second power line V2.

The OLED device layer M comprises a first OLED device M1 and a second OLED device M2.

The first power line V1 is electrically connected to the first capacitor c1 through at least one first via hole 10*a*. The first capacitor c1 is electrically connected to the first driving TFT DT1. The first driving TFT DT1 is electrically connected to the first OLED device M1. The second power line V2 is electrically connected to the second capacitor c2 through at least one second via hole 10*b*. The second capacitor c2 is electrically connected to the second driving TFT DT2. The second driving TFT DT2 is electrically connected to the second OLED device M2. The first OLED device M1 and the second OLED device M2 emit light of different colors.

An opening area of the at least one first via hole 10*a* is a first opening area, an opening area of the at least one second via hole 10*b* is a second opening area, and the first opening area is larger than the second opening area.

The first opening area is the sum of the opening areas of all the first via holes 10*a*, and the second opening area is the sum of the opening areas of all the second via holes 10*b*. In the display panel 100 of the present embodiment, the first opening area is larger than the second opening area to enhance dehydrogenation on the first driving TFT DT1 and to change electrical properties of the first driving TFT, thus improving afterimages. That is to say, during a manufacturing process of the present embodiment, the opening area of the first via hole 10*a* at the first driving TFT DT1 corresponding to the interlayer dielectric layer 108 is increased, so that when dehydrogenation treatment is performed on the first driving TFT DT1, hydrogen removal is enhanced, and thereby a hysteresis problem of the first driving TFT DT1 is reduced.

It is preferable that, the first via hole 10*a* is a round hole or a square hole; however, the present invention is not limited in this regard. The second via hole 10*b* is a round hole or a square hole, but the present invention is not limited in this regard.

It is preferable that, the first OLED device M1 is a green OLED device, and the second OLED device M2 is a first non-green OLED device, thereby improving an afterimage of a green image.

In the display panel 100 of the present embodiment, the display panel 100 further comprises a third driving TFT DT3, a third capacitor c3, a third power line V3, and a second non-green OLED device M3.

The third power line V3 is electrically connected to the third capacitor c3 through at least one third via hole 10*c*. The third capacitor c3 is electrically connected to the third driving TFT DT3. The third driving TFT DT3 is electrically connected to the second non-green OLED device M3.

An opening area of the at least one third via hole 10*c* is a third opening area. The first opening area is larger than the third opening area. The third opening area is the sum of the opening areas of all the third via holes 10*c*.

The first opening area is larger than the third opening area to further change the electrical properties of the first driving TFT DT1, thereby improving the afterimage of the green image.

In the display panel 100 of the present embodiment, the first non-green OLED device M2 is one of a red OLED device and a blue OLED device, and the second non-green OLED device M3 is the other one of the red OLED device and the blue OLED device.

In the present embodiment, the first non-green OLED device M2 is the red OLED device, and the second non-green OLED device M3 is the blue OLED device.

Certainly, in some embodiments, the first non-green OLED device M2 can also be the blue OLED device. The second non-green OLED device M3 is the red OLED device.

In the display panel 100 of the present embodiment, it is preferable that the second opening area is equal to the third opening area.

Such a configuration saves space on the one hand, and facilitates a layout of a mask on the other hand.

It is preferable that, the third via hole 10*c* is a round hole or a square hole; however, the present invention is not limited in this regard.

It should be noted that, under the same brightness requirements, among the red OLED device, the green OLED device M1, and the blue OLED device, the blue OLED device requires a highest driving current, the red OLED device requires a second highest driving current, and the green OLED device M1 requires a lowest driving current.

In the display panel of some embodiments, the first opening area is larger than the second opening area, and the second opening area is larger than the third opening area. Such a configuration ensures OLED devices of three colors to have currents respectively required to emit light, and improves the uniformity of the light-emitting brightness. On the other hand, the configuration improves the hysteresis problem of the first driving TFT DT1 and the second driving TFT DT2, thereby improving afterimages of the green image of the green OLED device and afterimages of the red image of the red OLED device.

In the display panel 100 of the present embodiment, it is preferable that the first opening area is N times the second opening area, and N is a positive integer greater than one. This improves the afterimage of the green image on the one hand, and on the other hand facilitates a process of making holes in the interlayer dielectric layer 108 and improve the efficiency of the hole making process.

In addition, the size of the first opening area not only affects the electrical properties of the first driving TFT DT1, but also affects a layout of other metals and affects the power transmission efficiency of the first power line V1. When the first opening area is less than 2 times the second opening area, the green image still has subtle afterimages when viewed with the naked eye. When the first opening area is larger than 3 times the second opening area, the first opening area is too large, which affects the subsequent manufacturing process and the power transmission of the first power line V1. The size of the first opening area is also limited by an area of the first capacitor c1.

It is preferable that, the first opening area is between 2 times the second opening area and 3 times the second opening area.

In the display panel 100 of the present embodiment, the number of the first via holes 10*a* is greater than the number of the second via holes 10*b* and the number of the third via holes 10*c*.

Specifically, the present embodiment has two first via holes 10*a*, one second via hole 10*b*, and one third via hole 10*c*, as an example; however, the present invention is not limited in this regard.

In addition, the opening area of one single first via hole 10*a* is equal to the opening area of one single second via hole 10*b*.

Figure 4:
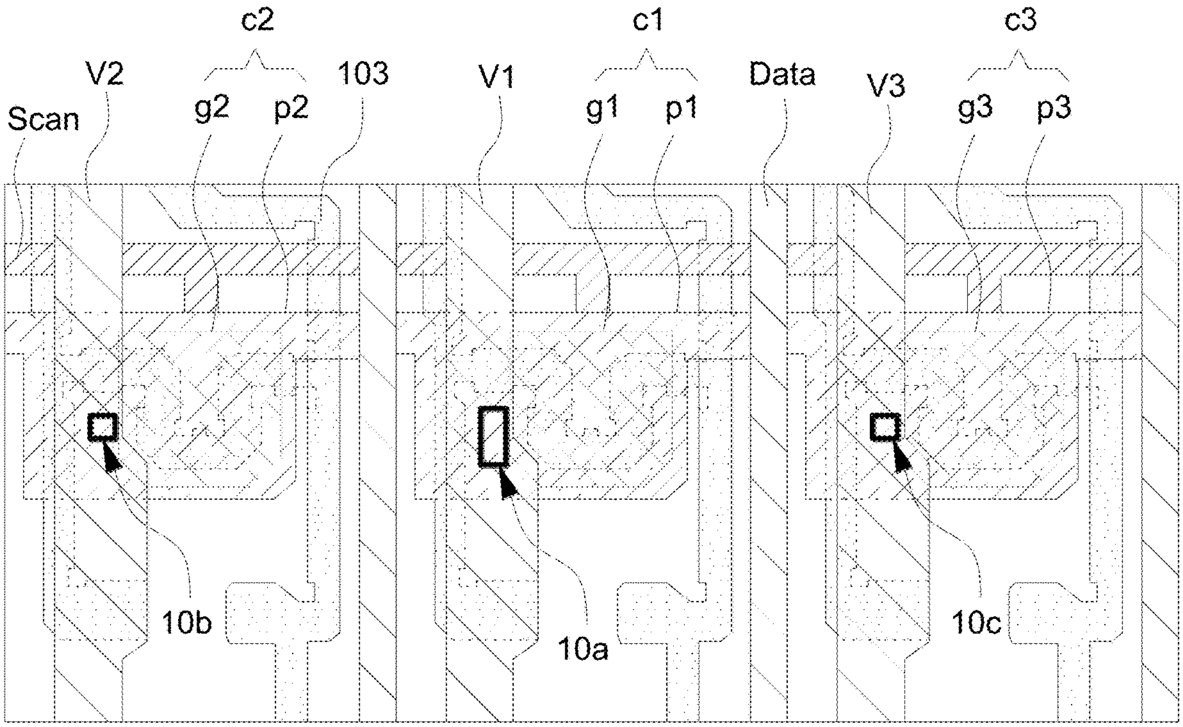
FIG. 4 is another schematic top view which illustrates a partial structure of the display panel according to one embodiment of the present invention.

In some embodiments, the number of the first via holes 10*a* is equal to the number of the second via holes 10*b* and the number of the third via holes 10*c*. As shown in FIG. 4, there is one first via hole 10*a*, one second via hole 10*b*, and one third via hole 10*c*.

In the display panel 100 of the present embodiment, as shown in FIG. 1, the first power line V1 and the first capacitor c1 are arranged in different layers. The first power line V1 is arranged on the first capacitor c1. The interlayer dielectric layer 108 is arranged between the first power line V1 and the first capacitor c1. The first via hole 10*a* is defined in the interlayer dielectric layer 108 and exposes the first capacitor c1.

The first power line V1 is connected to the first electrode p1 of the first capacitor c1 through the first via hole 10*a*.

The second power line V2 and the third power line V3 are arranged in the same layer as the first power line V1. The second capacitor c2 and the third capacitor c3 are arranged in the same layer as the first capacitor c1. The second via hole 10*b* and the third via hole 10*c* are defined in the interlayer dielectric layer 108. The second via hole 10*b* exposes the second capacitor c2, and the third via hole 10*c* exposes the third capacitor c3.

The second power line V2 is connected to the second electrode p2 of the second capacitor c2 through the second via hole 10*b*. The third power line V3 is connected to the third electrode p3 of the third capacitor c3 through the third via hole 10*c*.

In the display panel of the present invention, the first power line and the first capacitor are electrically connected to the green OLED device, and the second power line and the second capacitor are electrically connected to the first non-green OLED device. The first power line is electrically connected to the first capacitor through at least one first via hole, and the second power line is electrically connected to the second capacitor through at least one second via hole.

The opening area of at least one first via hole is the first opening area, the opening area of at least one second via hole is the second opening area, and the first opening area is set to be larger than the second opening area to thereby enhance hydrogen removal of the first driving TFT and change the electrical properties of the first driving TFT, thus improving the afterimage of the green image.

The above is a detailed description about a display panel of the present invention. In this disclosure, specific examples are used to explain the principles and embodiments of the present invention. The description of the above embodiments is only used for ease of understanding of the technical solutions and the main ideas of the present invention. Those of ordinary skill in the art should understand that they can modify the technical solutions in the foregoing embodiments, or equivalently replace some of the technical features. Such modifications or replacements should be deemed to be within the protection scope of the technical solution of the present invention.

What is claimed is:

1. A display panel, comprising a substrate and a first driving thin film transistor (TFT), a second driving TFT, a first capacitor, a second capacitor, a first power line, a second power line, a first organic light-emitting diode (OLED) device, and a second OLED device arranged on the substrate, wherein the first OLED device and the second OLED device emit light of different colors;

wherein the first power line is electrically connected to the first capacitor through at least one first via hole, the first capacitor is electrically connected to the first driving TFT, and the first driving TFT is electrically connected to the first OLED device; the second power line is electrically connected to the second capacitor through at least one second via hole, the second capacitor is electrically connected to the second driving TFT, and the second driving TFT is electrically connected to the second OLED device;

an opening area of the at least one first via hole corresponding to the first driving TFT is a first opening area, an opening area of the at least one second via hole corresponding to the second driving TFT is a second opening area, and the first opening area is larger than the second opening area such that a hydrogen removal efficiency of the first driving TFT is higher than a hydrogen removal efficiency of the second driving TFT; and the first OLED device is a green OLED device, and the second OLED device is a first non-green OLED device, wherein the display panel further comprises a third driving TFT, a third capacitor, a third power line, and a second non-green OLED device; the third power line is electrically connected to the third capacitor through at least one third via hole, the third capacitor is electrically connected to the third driving TFT, and the third driving TFT is electrically connected to the second non-green OLED device; and an opening area of the at least one third via hole corresponding to the third driving TFT is a third opening area, and the first opening area is larger than the third opening area such that a hydrogen removal efficiency of the first driving TFT is higher than a hydrogen removal efficiency of the third driving TFT.

2. The display panel according to claim 1, wherein the first non-green OLED device is one of a red OLED device and a blue OLED device, and the second non-green OLED device is the other one of the red OLED device and the blue OLED device.

3. The display panel according to claim 2, wherein the second opening area is equal to the third opening area.

4. The display panel according to claim 2, wherein the first non-green OLED device is the red OLED device, and the second non-green OLED device is the blue OLED device; and the second opening area is larger than the third opening area.

5. The display panel according to claim 2, wherein a number of the at least one first via hole is greater than a number of the at least one second via hole and a number of the at least one third via hole.

6. A display panel, comprising a first driving thin film transistor (TFT), a second driving TFT, a first capacitor, a second capacitor, a first power line, a second power line, a first organic light-emitting diode (OLED) device, and a second OLED device, wherein the first OLED device and the second OLED device emit light of different colors;

wherein the first power line is electrically connected to the first capacitor through at least one first via hole, the first capacitor is electrically connected to the first driving TFT, and the first driving TFT is electrically connected to the first OLED device; the second power line is electrically connected to the second capacitor through at least one second via hole, the second capacitor is electrically connected to the second driving TFT, and the second driving TFT is electrically connected to the second OLED device; and an opening area of the at least one first via hole corresponding to the first driving TFT is a first opening area, an opening area of the at least one second via hole corresponding to the second driving TFT is a second opening area, and the first opening area is larger than the second opening area such that a hydrogen removal efficiency of the first driving TFT is higher than a hydrogen removal efficiency of the second driving TFT;

wherein the first OLED device is a green OLED device, and the second OLED device is a first non-green OLED device;

wherein the display panel further comprises a third driving TFT, a third capacitor, a third power line, and a second non-green OLED device; the third power line is electrically connected to the third capacitor through at least one third via hole, the third capacitor is electrically connected to the third driving TFT, and the third driving TFT is electrically connected to the second non-green OLED device; and an opening area of the at least one third via hole corresponding to the third driving TFT is a third opening area, and the first opening area is larger than the third opening area such that a hydrogen removal efficiency of the first driving TFT is higher than a hydrogen removal efficiency of the third driving TFT.

7. The display panel according to claim 6, wherein the first non-green OLED device is one of a red OLED device and a blue OLED device, and the second non-green OLED device is the other one of the red OLED device and the blue OLED device.

8. The display panel according to claim 7, wherein the second opening area is equal to the third opening area.

9. The display panel according to claim 7, wherein the first non-green OLED device is the red OLED device, and the second non-green OLED device is the blue OLED device; and the second opening area is larger than the third opening area.

10. The display panel according to claim 7, wherein a number of the at least one first via hole is greater than a number of the at least one second via hole and a number of the at least one third via hole.

11. The display panel according to claim 7, wherein a number of the at least one first via hole is equal to a number of the at least one second via hole and a number of the at least one third via hole.

12. The display panel according to claim 6, wherein the first power line and the first capacitor are arranged in different layers, the first power line is arranged on the first capacitor, and an interlayer dielectric layer is arranged between the first power line and the first capacitor, and the first via hole is defined in the interlayer dielectric layer and exposes the first capacitor; and the first power line is connected to the first capacitor through the first via hole.

13. The display panel according to claim 12, wherein the second power line and the third power line are arranged in the same layer as the first power line; the second capacitor and the third capacitor are arranged in the same layer as the first capacitor; the second via hole and the third via hole are defined in the interlayer dielectric layer, the second via hole exposes the second capacitor, and the third via hole exposes the third capacitor; and the second power line is connected to the second capacitor through the second via hole, and the third power line is connected to the third capacitor through the third via hole.

14. The display panel according to claim 12, wherein the first driving TFT comprises a first gate, and the first capacitor comprises the first gate and a first electrode stacked on the first gate; the first via hole overlaps the first electrode; and an orthographic projection of the first via hole projected on a plane where the first gate is located is outside the first gate.

15. The display panel according to claim 13, wherein the second driving TFT comprises a second gate, and the second capacitor comprises the second gate and a second electrode stacked on the second gate; the second via hole overlaps the second electrode; and an orthographic projection of the second via hole projected on a plane where the second gate is located is outside the second gate.

16. The display panel according to claim 6, wherein the first opening area is N times the second opening area, and N is a positive integer greater than one.

17. The display panel according to claim 16, wherein the first opening area is between 2 times and 3 times the second opening area.

* * * * *